(12) United States Patent
Fujimaki (10) Patent No.: US 7,955,151 B2
(45) Date of Patent: Jun. 7, 2011

(54) METHOD OF REPAIRING BRIGHT SPOT DEFECT OF ORGANIC LIGHT-EMITTING DISPLAY

(75) Inventor: Hiroshi Fujimaki, Tokyo (JP)

(73) Assignee: Sony Corporation, Tokyo (JP)

( * ) Notice: Subject to any disclaimer, the term of this patent is extended or adjusted under 35 U.S.C. 154(b) by 304 days.

(21) Appl. No.: 12/195,129

(22) Filed: Aug. 20, 2008

(65) Prior Publication Data

US 2009/0061720 A1   Mar. 5, 2009

(30) Foreign Application Priority Data

Sep. 5, 2007   (JP) ................... 2007-229848

(51) Int. Cl.
*H01J 9/50*   (2006.01)
(52) U.S. Cl. .............. 445/2; 445/3; 445/61; 445/63
(58) Field of Classification Search ......... 313/498–512; 438/4; 445/2–3, 24, 61, 63
See application file for complete search history.

(56) References Cited

U.S. PATENT DOCUMENTS

| | | | | |
|---|---|---|---|---|
| 5,018,212 | A * | 5/1991 | Manns et al. | 382/145 |
| 7,234,984 | B2 * | 6/2007 | Nishikawa et al. | 445/2 |
| 7,701,133 | B2 * | 4/2010 | Kajiyama et al. | 313/504 |
| 2003/0222861 | A1 * | 12/2003 | Nishikawa et al. | 345/204 |
| 2005/0215163 | A1 * | 9/2005 | Tamura et al. | 445/24 |
| 2005/0259190 | A1 * | 11/2005 | Wang et al. | 349/38 |
| 2007/0046186 | A1 * | 3/2007 | Kim | 313/504 |
| 2007/0081108 | A1 * | 4/2007 | Tsukada | 349/54 |
| 2007/0126460 | A1 * | 6/2007 | Chung et al. | 324/770 |
| 2007/0141360 | A1 | 6/2007 | Beteille | |

FOREIGN PATENT DOCUMENTS

| | | |
|---|---|---|
| JP | SHO 62-287596 | 12/1987 |
| JP | 09318959 A * | 12/1997 |
| JP | 2001-237082 | 8/2001 |
| JP | 2003-178871 | 6/2003 |
| JP | 2003-233329 | 8/2003 |
| JP | 2005-276600 | 10/2005 |
| JP | 2006-502545 | 1/2006 |
| JP | 2006-323032 | 11/2006 |
| JP | 2007-066904 | 3/2007 |

OTHER PUBLICATIONS

Japanese Patent Office dated Nov. 2, 2010, for corresponding Japanese Patent Appln. No. 2007-229848.

* cited by examiner

*Primary Examiner* — Nimeshkumar D Patel
*Assistant Examiner* — Jose M Diaz
(74) *Attorney, Agent, or Firm* — K&L Gates LLP (57) ABSTRACT

A method of repairing an organic light-emitting display capable of reducing an eliminated area of an electrode or the like, and preventing a decline in display quality is provided. The method of repairing an organic light-emitting display, the organic light-emitting display including an organic light-emitting device, the organic-emitting device including a plurality of pixels, each of the plurality of pixels including a first electrode, an organic layer including a light-emitting layer, and a second electrode on a substrate in order, each of the plurality of pixels emitting light from a light-emitting region where the first electrode and the second electrode overlap each other with the organic layer in between, the method includes a step of: applying a laser beam to the periphery of a light-emitting region of a pixel which is constantly a bright spot.

7 Claims, 13 Drawing Sheets

METHOD OF REPAIRING BRIGHT SPOT DEFECT OF ORGANIC LIGHT-EMITTING DISPLAY

CROSS REFERENCES TO RELATED APPLICATIONS

The present application claims priority to Japanese Patent Application JP 2007-229848 filed in the Japanese Patent Office on Sep. 5, 2007, the entire contents of which is being incorporated herein by reference.

BACKGROUND

The present application relates to a method of repairing an organic light-emitting display, and more specifically to a method of repairing an organic light-emitting display suitable for repairing a bright spot defective pixel such as a pixel which is constantly lit.

In organic light-emitting displays, pixel defects include a defect called a bright spot in addition to a so-called dark spot which remains unlit. Examples of the bright spot include a pixel which is constantly lit at the maximum intensity, a pixel which is lit brighter than others (a pixel which is lit at, for example, 20% higher intensity even during normal operation), and a pixel which is lit under the influence of another color (such as a pixel which is lit blue when the pixel is supposed to be lit red), and in the case where a bright spot is present in a dark background, the bright spot is visible the most easily. Such a bright spot defect may not be caused by an organic light-emitting device, and the bright spot defect may occur, because a TFT circuit does not work properly due to a defect of a TFT (Thin Film Transistor) for driving.

As a method of repairing a bright spot defect in a related art, a method of applying a laser to the whole surface of a bright spot pixel to eliminate an organic layer or an electrode is known (for example, refer to Japanese Unexamined Patent Application Publication Nos. 2003-178871 and 2003-233329).

Figure 16A:
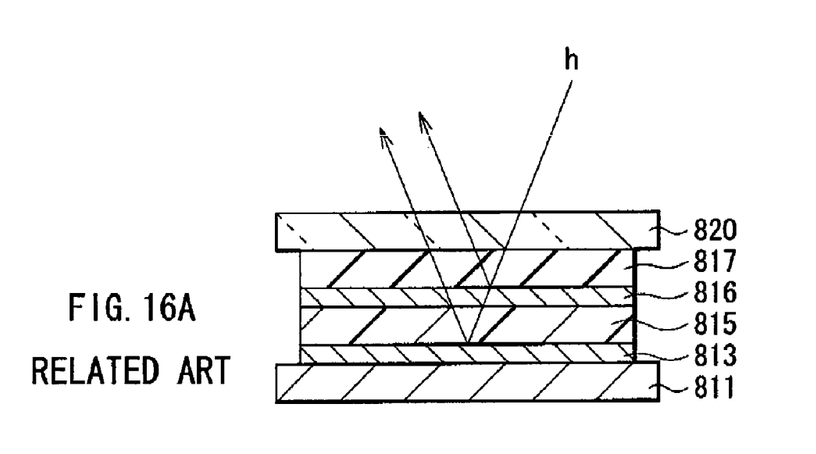
FIGS. 16A, 16B and 16C are illustrations for describing a method of repairing in a related art.
Figure 16B:
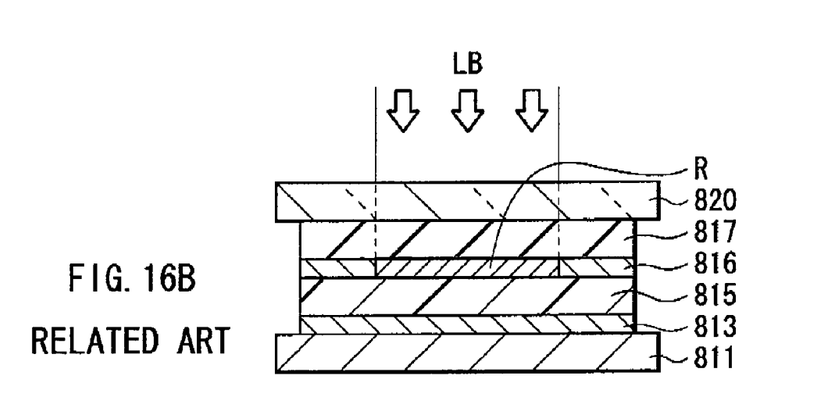

For example, as shown in FIG. 16A, a normal pixel of an organic light-emitting device has a configuration in which a first electrode 813, an organic layer 815, a second electrode 816 and a protective layer 817 are laminated in this order on a TFT substrate 810, and a facing substrate 820 is arranged on the protective layer 817. In the case where a bright spot defect occurs, as shown in FIG. 16B, for example, a laser beam LB is applied to the whole surface of a bright spot pixel from the second electrode 816 side to eliminate a laser applied portion R of the second electrode 816 and block a current, thereby the light-emitting operation of the pixel is stopped (the pixel is turned into a dark spot).

SUMMARY

Figure 16C:
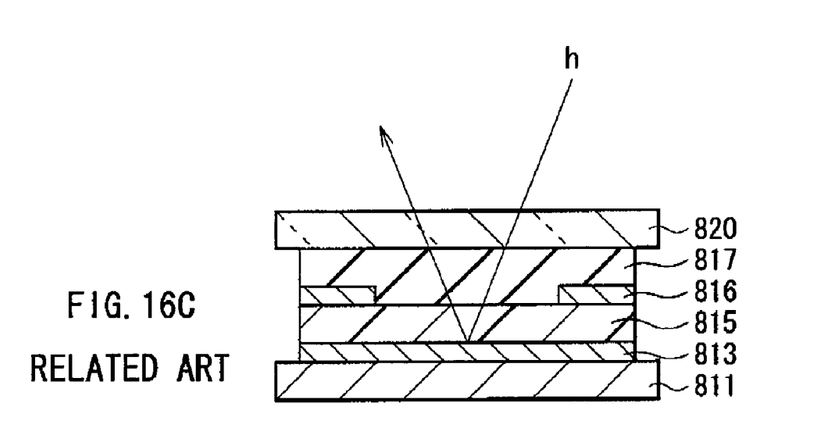

However, in a method of applying a laser to the whole surface of a bright spot pixel in a related art, a laser applied portion of an organic layer or an electrode is eliminated, so the configuration of the laser applied portion of the pixel is different from the configuration of a portion where the laser is not applied of the pixel. In a normal pixel, external light h is reflected by the second electrode 816 and the first electrode 813, and in a pixel which is turned into a dark spot by laser irradiation, as shown in FIG. 16C, the laser applied portion R of the second electrode 816 is eliminated, so reflectivity is changed. Therefore, visibility of the pixel which is turned into a dark spot by reflection of external light is different from visibility of the normal pixel, thereby display quality declines.

In view of the foregoing, it is desirable to provide a method of repairing an organic light-emitting display capable of reducing an eliminated area of an electrode or the like, and preventing a decline in display quality.

According to an embodiment of the application, there is provided a method of repairing an organic light-emitting display, the organic light-emitting display including an organic light-emitting device, the organic-emitting device including a plurality of pixels, each of the plurality of pixels including a first electrode, an organic layer including a light-emitting layer, and a second electrode on a substrate in order, each of the plurality of pixels emitting light from a light-emitting region where the first electrode and the second electrode overlap each other with the organic layer in between, the method including a step of applying a laser beam to the periphery of a light-emitting region of a pixel which is constantly a bright spot.

In the method of repairing an organic light-emitting display according to the embodiment of the application, a laser beam is applied to the periphery of a light-emitting region of a pixel which is constantly a bright spot, so a laser beam applied portion of the first electrode or the second electrode is eliminated. Therefore, a current does not flow in the light-emitting region, so the light-emitting operation of the pixel is stopped. Moreover, the laser beam is applied to the periphery of the light-emitting region, so the eliminated area of the first electrode or the second electrode is reduced, and the first electrode and the second electrode in the light-emitting region remains without being eliminated, so visibility of the pixel by reflection of external light is rarely different from visibility of normal pixels around the pixel. Therefore, a decline in display quality is prevented.

In the method of repairing an organic light-emitting display according to the embodiment of the application, a laser beam is applied to the periphery of the light-emitting region of a pixel which is constantly a bright spot, so the eliminated area of an electrode or the like is able to be reduced. Therefore, a decline in display quality which is that visibility of the pixel by reflection of external light is changed due to the elimination of the electrode in the light-emitting region is able to be prevented. In particular, when the size of the display is increased, and the size of the light-emitting region is increased in proportion to the size of the display, the ratio of the eliminated area of the electrode to the area of the light-emitting region is able to be reduced, and a more remarkable effect of improving display quality is able to be obtained.

Other and further objects, features and advantages of the application will appear more fully from the following description.

Additional features and advantages are described herein, and will be apparent from the following Detailed Description and the figures.

BRIEF DESCRIPTION OF THE FIGURES

FIGS. 15A, 15B, 15C, 15D, 15E, 15F and 15G are a front view and a side view of an application example 5 in an opened state, and a front view, a left side view, a right side view, a top view and a bottom view of the application example 5 in a closed state, respectively.

DETAILED DESCRIPTION

A preferred embodiment will be described in detail below referring to the accompanying drawings.

Figure 1:
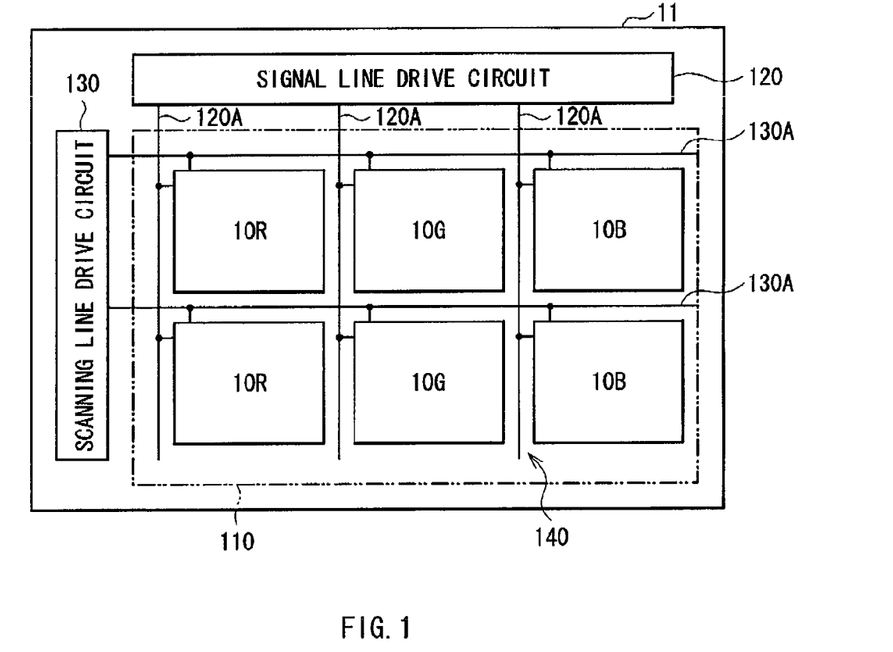
FIG. 1 is an illustration showing steps of a method of manufacturing a display according to an embodiment of the application in order.

FIGS. 1 to 10 show steps of a method of manufacturing an organic light emitting display (hereinafter simply referred to as display) according to an embodiment of the application including a method of repairing in order. At first, as shown in FIG. 1, a signal line drive circuit 120 and a scanning line drive circuit 130 which are drivers for video display are formed around a display region 110 on a substrate 11 made of glass, a silicon (Si) wafer, a resin or the like, and a pixel drive circuit 140 is formed in the display region 110. As will be described later, the display region 110 is a region where organic light-emitting devices 10R emitting red light, organic light-emitting devices 10G emitting green light and organic light-emitting devices 10B emitting blue light are arranged in a matrix form. The organic light-emitting devices 10R, 10G and 10B each constitute one subpixel, and a combination of organic light-emitting devices 10R, 10G and 10B adjacent to one another constitutes one pixel.

Figure 2:
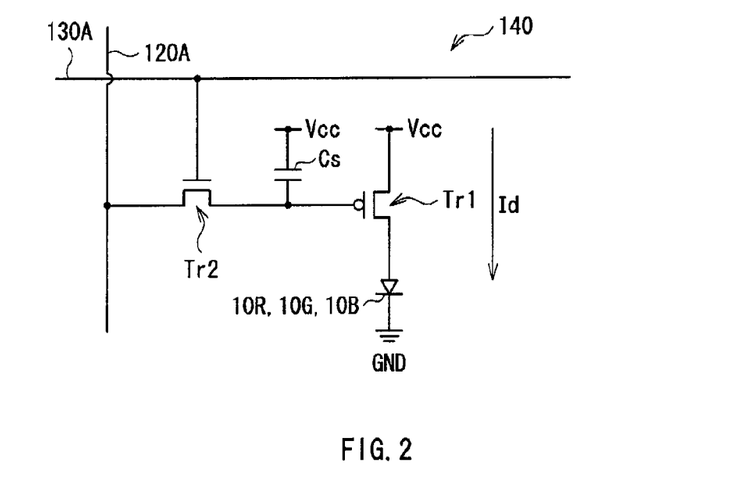
FIG. 2 is an illustration showing an example of a pixel drive circuit shown in FIG. 1.

FIG. 2 shows an example of the pixel drive circuit 140. The pixel drive circuit 140 is an active drive circuit including a drive transistor Tr1 and a write transistor Tr2, a capacitor (retention capacitor) Cs between the drive transistor Tr1 and the write transistor Tr2, and the organic light-emitting drive 10R (or 10G or 10B) connected to the drive transistor Tr1 in series between a first power source line (Vcc) and a second power source line (GND), and the pixel drive circuit 140 is formed in a lower layer of a first electrode 13 which will be described later. The drive transistor Tr1 and the write transistor Tr2 each are configured of a typical thin film transistor (TFT), and the configurations of the drive transistor Tr1 and the write transistor Tr2 may be of, for example, an inverted staggered type (so-called bottom gate type) or a staggered type (top gate type), and are not specifically limited.

In the pixel drive circuit 140, a plurality of signal lines 120A are arranged in a column direction and a plurality of scanning lines 130A are arranged in a row direction. An intersection of each signal line 120A and each scanning line 130A corresponds to one of the organic light-emitting devices 10R, 10G and 10B (a subpixel). Each signal line 120A is connected to the signal line drive circuit 120, and an image signal is supplied from the signal line drive circuit 120 to a source electrode of the write transistor Tr2 through the signal line 120A. Each scanning line 130A is connected to the scanning line drive circuit 130, and a scanning signal is sequentially supplied from the scanning line drive circuit 130 to a gate electrode of the write transistor Tr2 through the scanning line 130A.

Figure 3:
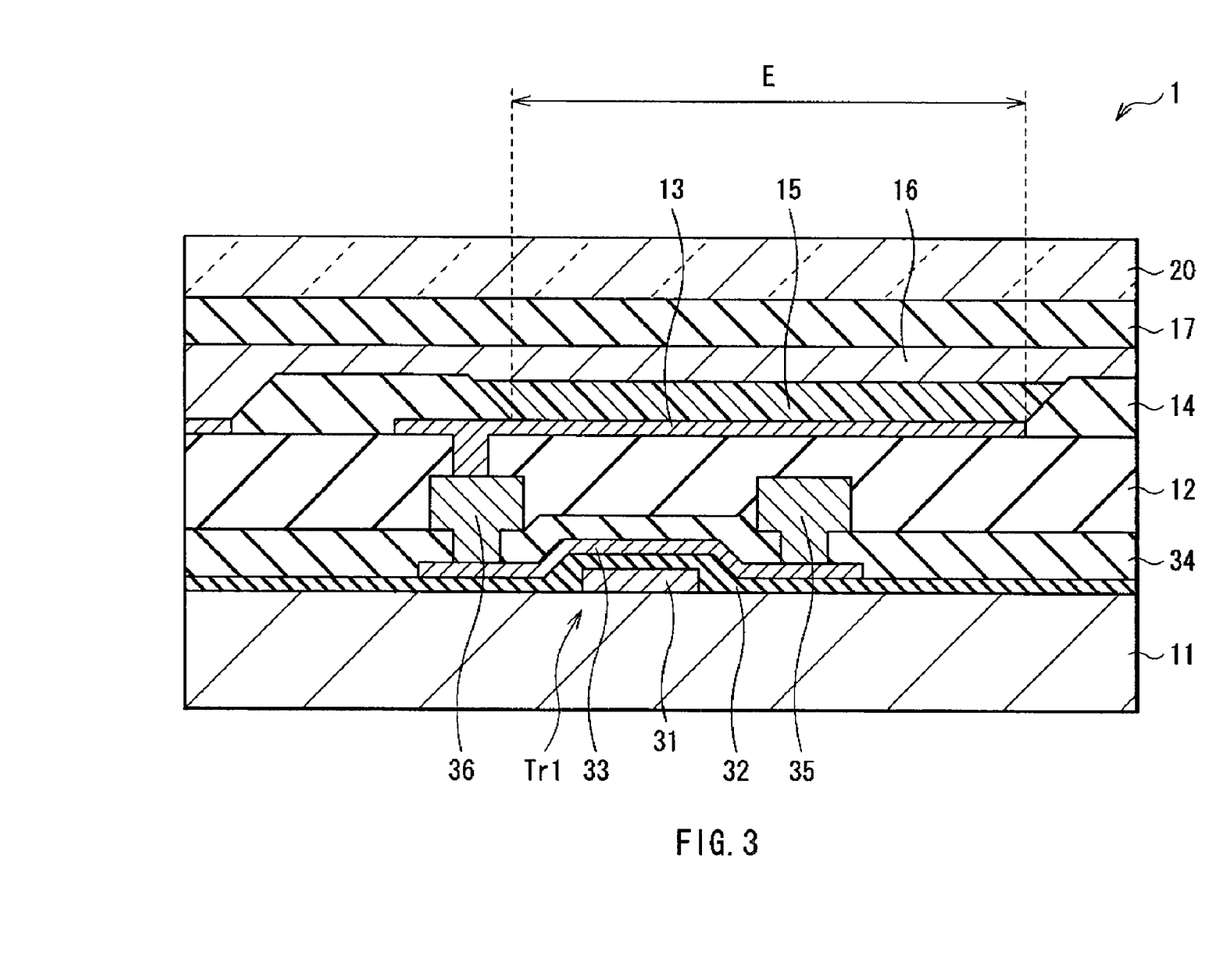
FIG. 3 is a sectional view showing a step following steps of FIGS. 1 and 2.

Next, a step of manufacturing the organic light-emitting device 10R (or 10G or 10B) constituting one subpixel will be described below referring to FIG. 3. As shown in FIG. 3, the drive transistor Tr1 of the pixel drive circuit 140 is formed on the substrate 11. In other words, a gate electrode 31 is formed on the substrate 11, and a semiconductor thin film 33 made of, for example, polycrystalline silicon is formed on the gate electrode 31 with a gate insulating film 32 in between, and a source electrode 35 and a drain electrode 36 are connected to the semiconductor thin film 33 with an interlayer insulating film 34 in between.

Next, as shown in FIG. 3, the whole substrate 11 on which the pixel drive circuit 140 including the drive transistor Tr1 is formed is coated with a photosensitive resin to form a planarization insulating film 12, and the planarization insulating film 12 is patterned into a predetermined shape by exposure and development to form a connecting hole 12A, and the planarization insulating film 12 is fired.

After that, as shown in FIG. 3, the first electrode 13 is formed by, for example, a sputtering method. The thickness in a laminate direction (hereinafter simply referred to as thickness) of the first electrode 13 is, for example, within a range from 100 nm to 1000 nm both inclusive, and as the material of the first electrode 13, for example, the simple substance or an alloy of a metal element such as nickel, silver, gold, platinum, palladium, selenium, rhodium, ruthenium, iridium, rhenium, tungsten, molybdenum, chromium, tantalum or niobium is used. After that, the first electrode 13 is selectively removed by etching to separate the first electrode 13 into the organic light-emitting devices 10R, 10G and 10B.

After the first electrode 13 is formed, as shown in FIG. 3, the whole surface of the substrate 11 is coated with a photosensitive resin, and an opening corresponding to the first electrode 13 is arranged in the photosensitive resin by, for example, a photolithography method, and the photosensitive resin is fired to form an inter-electrode insulating film 14.

After the inter-electrode insulating film 14 is formed, as shown in FIG. 3, an organic layer 15 and a second electrode 16 are formed in order by, for example, an evaporation method to form the organic light-emitting devices 10R, 10G and 10B. At this time, the inside of the opening of the inter-electrode insulating film 14 is a light-emitting region E where the first electrode 13 and the second electrode 16 overlap each other with the organic layer 15 in between, and the organic light-emitting devices 10R, 10G and 10B emit light in the light-emitting region E.

The organic layer 15 may have a configuration in which a hole injection layer, a hole transport layer, a light-emitting layer and an electron transport layer (all not shown) are laminated in this order from the first electrode 13 side. Among them, layers except for the light-emitting layer may be arranged if necessary. Moreover, the organic layers 15 of the organic light-emitting devices 10R, 10G and 10B may have different configurations. The hole injection layer is provided to improve hole injection efficiency, and is a buffer layer for preventing leakage. The hole transport layer is provided to improve hole transport efficiency to the light-emitting layer. The light-emitting layer emits light by applying an electric field to recombine electrons and holes. The electron transport layer is provided to improve electron transport efficiency to the light-emitting layer. The thickness of the organic layer 15 is, for example, within a range from 100 nm to 220 nm so that a sufficient thickness for light emission is securable. In addition, an electron injection layer (not shown) made of LiF, $Li_2O$ or the like may be arranged between the electron transport layer and the second electrode 16.

In the organic layer 15 of the organic light-emitting device 10R, as the material of the hole injection layer, for example, 4,4',4"-tris(3-methylphenyl phenyl amino)triphenylamine (m-MTDATA) or 4,4',4"-tris(2-naphthyl phenyl amino)triphenylamine (2-TNATA) is used, and as the material of the hole transport layer, for example, bis[(N-naphthyl)-N-phenyl] benzidine (α-NPD) is used, and as the material of the light-emitting layer, for example, an 8-quinolinol aluminum complex ($Alq_3$) mixed with 40 vol % of 2,6-bis[4-[N-(4-methoxyphenyl)-N-phenyl]aminostyryl]naphthalene-1,5-dicarbonitrile (BSN-BCN) is used, and as the material of the electron transport layer, for example, $Alq_3$ is used.

In the organic layer 15 of the organic light-emitting device 10G, as the material of the hole injection layer, for example, m-MTDATA or 2-TNATA is used, and as the material of the hole transport layer, for example, α-NPD is used, and as the material of the light-emitting layer, for example, $Alq_3$ mixed with 3 vol % of Coumarin6 is used, and as the material of the electron transport layer, for example, $Alq_3$ is used.

In the organic layer 15 of the organic light-emitting device 10B, as the material of the hole injection layer, for example, m-MTDATA or 2-TNATA is used, and as the material of the hole transport layer, for example, α-NPD is used, and as the material of the light-emitting layer, for example, spiro6Φ is used, and as the material of the electron transport layer, for example, $Alq_3$ is used.

The thickness of the second electrode 16 is, for example, within a range from 5 nm to 50 nm both inclusive, and as the material of the second electrode 16, for example, the simple substance or an alloy of a metal element such as lithium, magnesium, calcium, sodium, silver, aluminum and indium is used. Among them, an alloy of magnesium and silver (an MgAg alloy) or an alloy of aluminum (Al) and lithium (Li) (an AlLi alloy) is preferable.

After the organic layer 15 and the second electrode 16 are formed, as shown in FIG. 3, a protective film 17 is formed on the organic light-emitting devices 10R, 10G and 10B, and a facing substrate 20 for sealing is bonded to the protective film 17 by an adhesive layer (not shown). Thus, the display 1 is completed.

Figure 4:
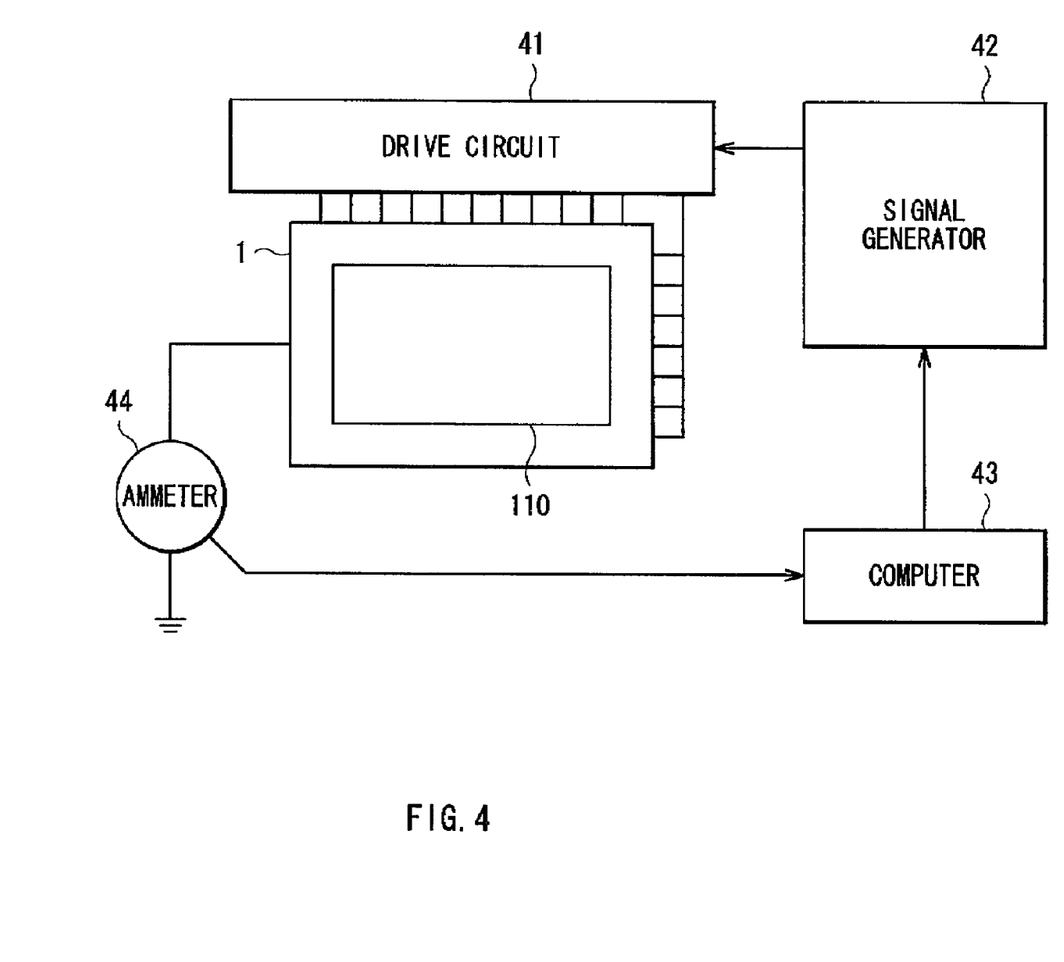
FIG. 4 is an illustration showing the whole configuration of a repair apparatus used in a step following the step of FIG. 3.

FIG. 4 shows the whole configuration of a repair apparatus used in a method of repairing such a display 1. The repair apparatus 40 repairs a pixel which is constantly a bright spot in the display 1, and includes, for example, a drive circuit 41, a signal generator 42, a computer 43 and an ammeter 44. The repair apparatus 40 may have a function which is necessary in a typical repair apparatus such as a function of detecting and repairing a non-light-emission defect (a dark spot) due to a short circuit of the first electrode 13 and the second electrode 16 or a defect in the pixel drive circuit 140.

Figure 5A:
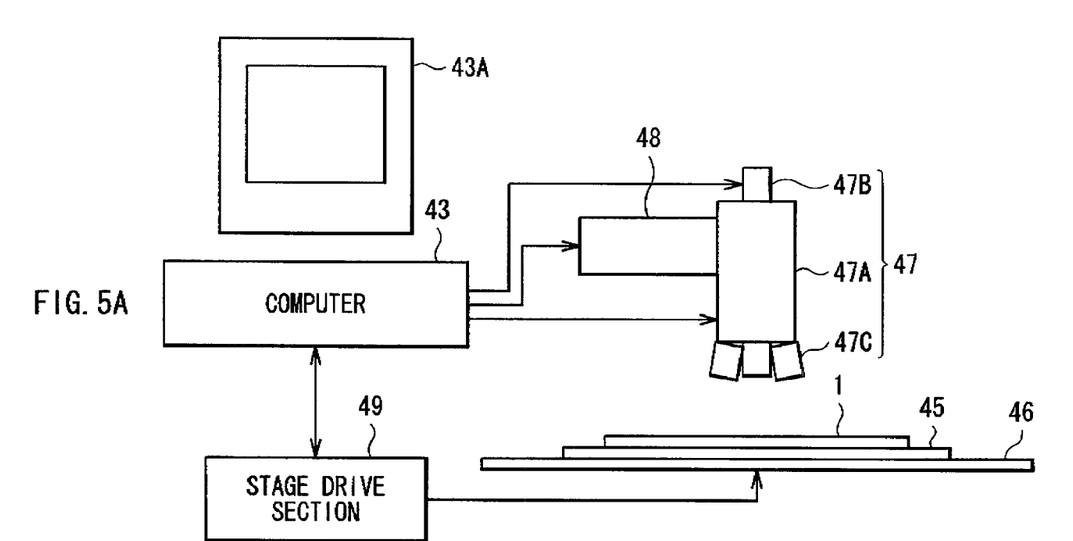
FIGS. 5A and 5B are a side view and a top view of the repair apparatus shown in FIG. 4.
Figure 5B:
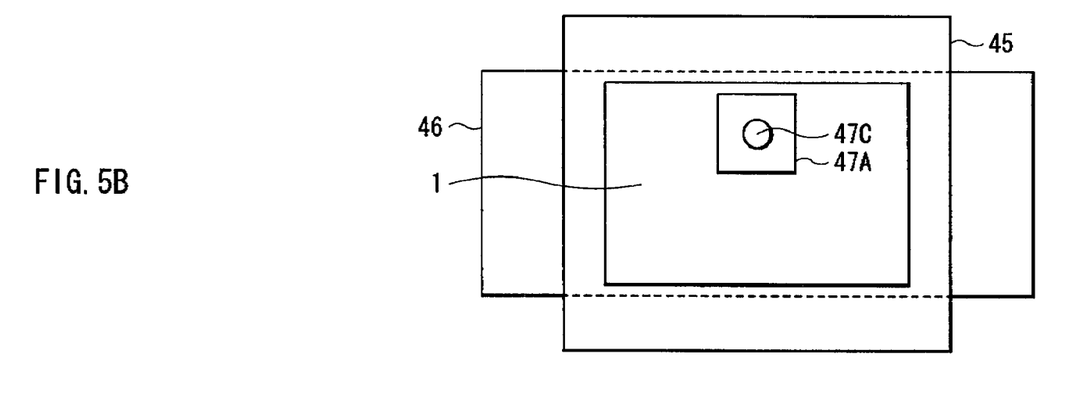

The drive circuit 41 drives the display 1, and has, for example, a function of concurrently emitting light from the whole surface of the display region 110, that is, all pixels, a function of individually lighting up pixels, that is, the organic light-emitting devices 10R, 10G and 10B, and a function of displaying black (a dark background). Moreover, the drive circuit 41 may also have a function of emitting light from a pixel in a region approximately equal to a field of view observable by an optical microscope (not shown in FIG. 4, refer to FIG. 5).

The signal generator 42 generates a control signal for controlling the drive of the drive circuit 41. The computer 43 controls the whole repair apparatus 40. The ammeter 44 measures a current passing through each pixel when the display 1 is driven, and is connected to the power source of the display 1.

FIG. 5A is a side view of the repair apparatus 40, and FIG. 5B is a plan view of the repair apparatus 40. More specifically, the repair apparatus 40 includes, for example, a table 45 where the display 1 is mounted and fixed, an XY stage 46 two-dimensionally moving the table 45, an observation section 47, a laser irradiation section 48 and a stage drive section 49. The repair apparatus 40 may include an infrared thermometer or an infrared imaging device for observing the heat generation state of the display 1.

The observation section 47 is arranged above the table 45, and includes, for example, an optical microscope 47A capable of observing a pixel surface and applying a laser and a camera 47B configured of a CCD or the like. The optical microscope 47A includes a plurality of lens systems 47C with different magnifications. For example, an image taken by the camera 47B is displayed on a monitor 43A of the computer 43.

The laser irradiation section 48 applies a laser beam for a repair process. The kind of laser is not specifically limited, and various kinds of lasers such as, for example, an Nd:YAG laser and a semiconductor laser may be used. The wavelength of the laser beam is not specifically limited; however, a wavelength of 600 nm or higher at which absorption into a glass substrate or an organic material is low and absorption into a metal material is high is preferable. The laser oscillation may be continuous oscillation or pulse oscillation.

The stage drive section 49 has a function of moving the XY stage 46 and a function of measuring the position of a pixel. The XY stage 46 is preferably of an automatic type controlled by a computer, and in particular, when linear scales are arranged in X and Y directions, an integration error is reduced, and a laser irradiation position is able to be recorded precisely.

Repairing by the repair apparatus 40 is able to be performed as follows.

At first, the display 1 is arranged and fixed on the table 45, and a plurality of reference points on the display 1 are adjusted to meet the laser irradiation position of the field of view of the optical microscope 47A, thereby the origin position and coordinate axes of the display 1 are determined.

Figure 6:
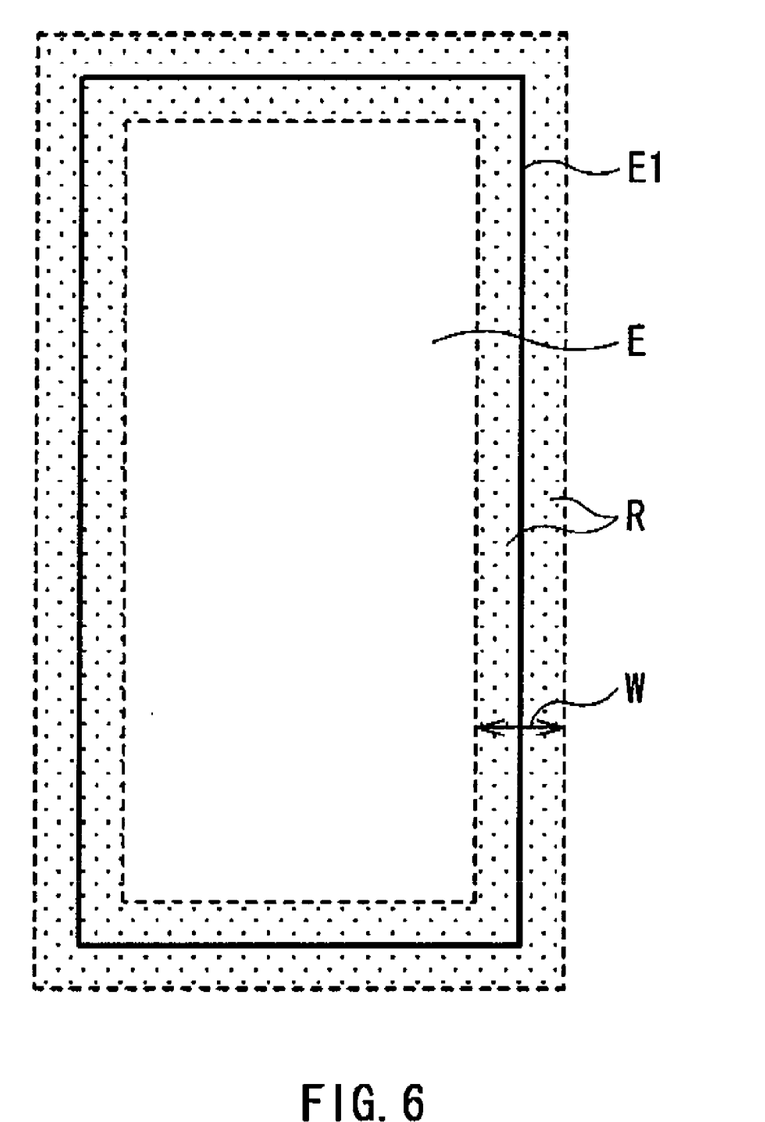
FIG. 6 is a plan view for describing a method of repairing using the repair apparatus shown in FIGS. 4 and 5.
Figure 7:
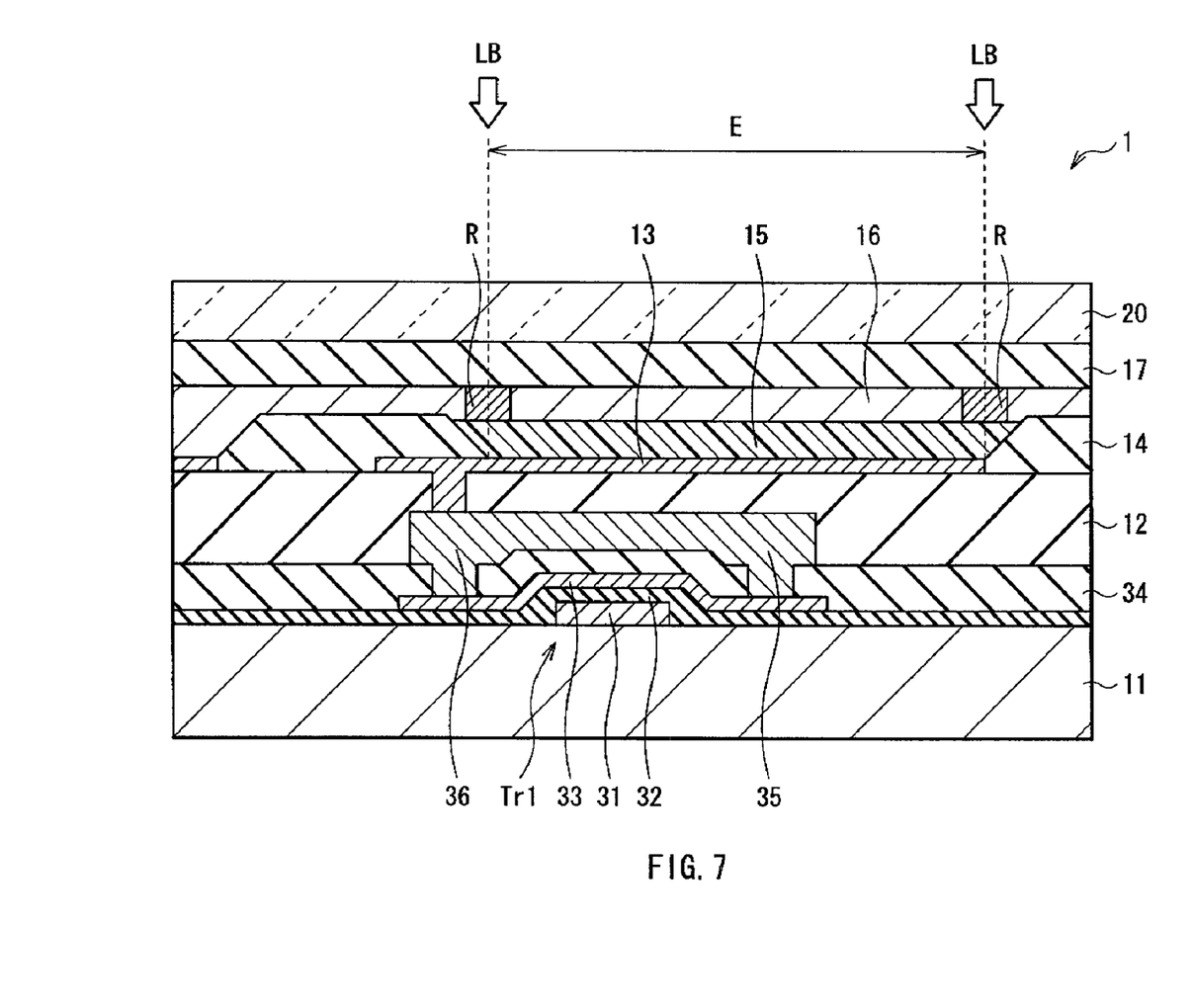
FIG. 7 is a sectional view for describing the method of repairing shown in FIG. 6.

Next, the display 1 is driven in a black display state by a control signal from the signal generator 42. At this time, if a bright spot defect occurs, the pixel is lit. As shown in FIGS. 6 and 7, the pixel is caught by a laser irradiation point in the field of view of the optical microscope 47A, and a laser beam LB is applied from, for example, the second electrode 16 side to the periphery E1 of the light-emitting region E of the pixel to eliminate the second electrode 16 in an laser applied portion R.

Thereby, a current does not flow in the light-emitting region E, and the light-emitting operation of the pixel is stopped. Moreover, the laser beam LB is applied to the periphery E1 of the light-emitting region E, so the eliminated area of the second electrode 16 is reduced, and the first electrode 13 and the second electrode 16 in the light-emitting region E are not eliminated and remain, so the visibility of the pixel by reflection of external light is rarely different from the visibility of normal pixels around the pixel. Therefore, a decline in display quality is reduced.

As long as the width W of the laser beam applied portion (laser applied portion) R is a width capable of eliminating the second electrode 16 and preventing a current from flowing, the width W is not specifically limited; however, the width W is preferably, for example, 20 μm or less. It is because a laser applied area is able to be reduced, and the eliminated area of the second electrode 16 is able to be reduced. The laser beam applied portion R may extend off inside, outside or both of the light-emitting region E.

Figure 8:
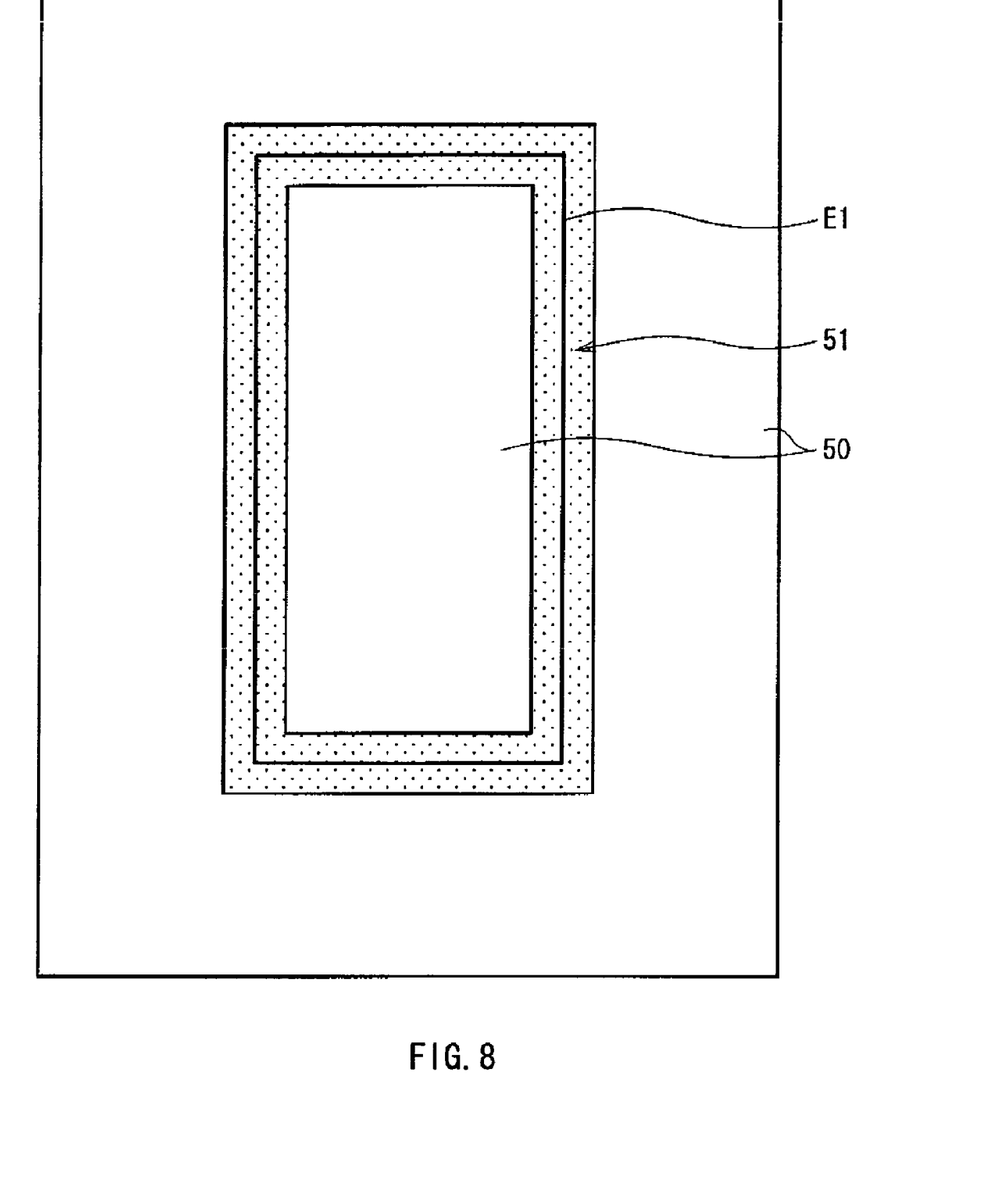
FIG. 8 is a plan view showing a mask used for laser irradiation.
Figure 9:
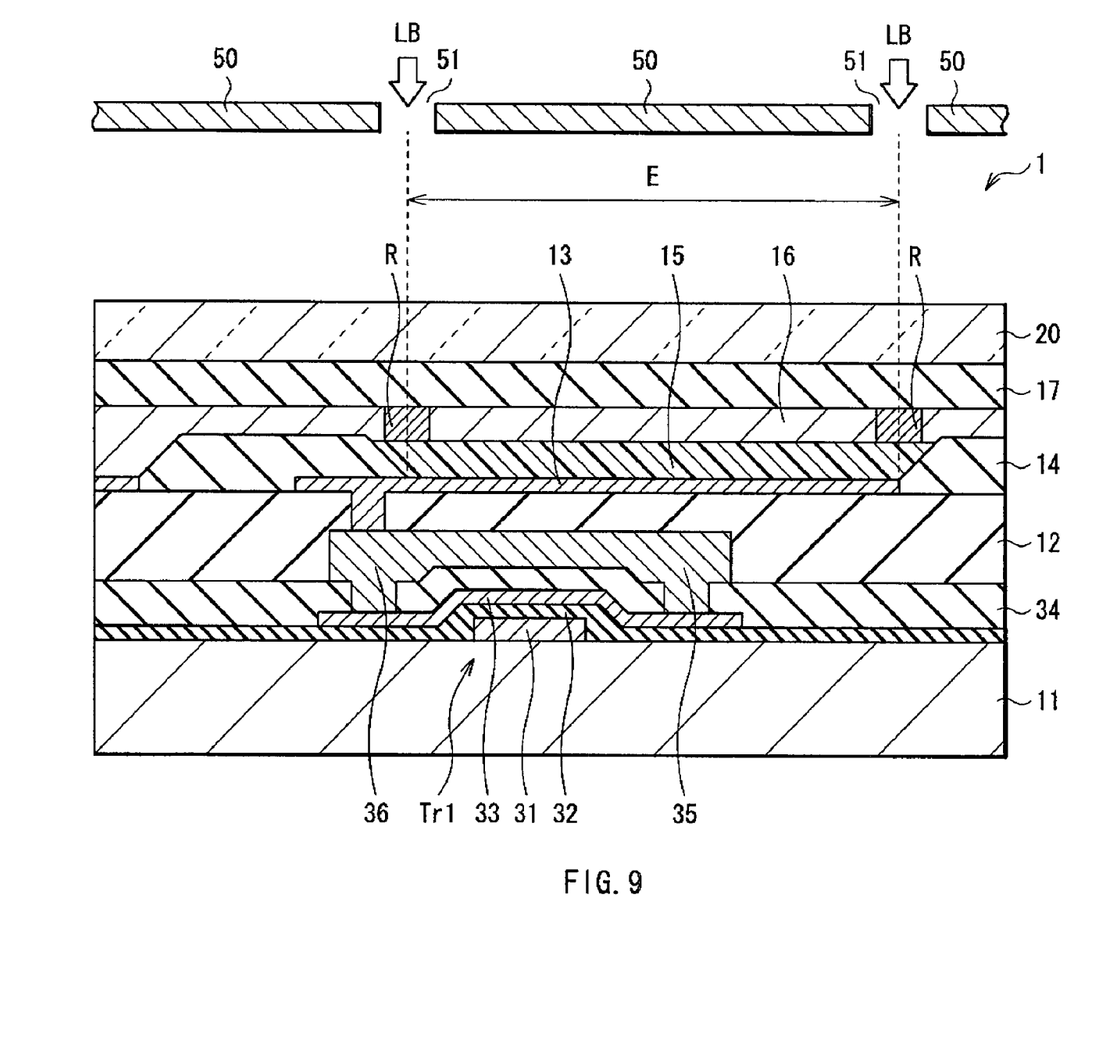
FIG. 9 is a sectional view showing a method of applying a laser using the mask shown in FIG. 8.

As a method of applying the laser beam LB, as long as the laser beam LB is able to be applied to the whole periphery E1 of the light-emitting region E, the method is not specifically limited. For example, the laser beam LB may be applied along the periphery E1 of the light-emitting region E several times. Moreover, as shown in FIGS. 8 and 9, a mask 50 having a rectangular opening 51 with a shape corresponding to the periphery E1 of the light-emitting region E is used, and the laser beam LB may be applied to the periphery E1 of the light-emitting region E through the opening 51 of the mask 50, thereby throughput may be enhanced. Further, instead of the mask 50, a slit (a linear opening) may be used.

For example, in the case where the size of the light-emitting region E is 100 μm×50 μm, the width W of the laser applied portion R is 20 μm, and the laser applied portion R extends off inside and outside of the light-emitting region E in the same manner (extends off 10 μm outside and 10 μm inside), the laser beam applied area (=an eliminated area of an electrode) is 3000 μm$^2$ with respect to the area of the light-emitting region E of 5000 μm$^2$. In a method in a related art, the laser beam is applied to the whole light-emitting region, and the same area of the electrode as the area of the light-emitting region is eliminated, so in the embodiment, compared to the related art, the electrode elimination ratio is 60%, and the influence of external light reflection is 60%. Therefore, display quality is improved.

Moreover, the width W of the laser applied portion R may be approximately 1 μm to 2 μm. For example, in the case where the width W is 2 μm, the electrode elimination ratio is 6%. When the ratio is at this level, a difference in external light reflection is not recognized by visual inspection, and there is little decline in display quality.

The size of the light-emitting region E is not related to the width precision of the laser beam, so even if the size of the light-emitting region E is twice as large as before, it is not necessary to change the width W of the laser applied portion R. Therefore, in the case where the width W is 20 μm, the electrode elimination ratio is 30%, and in the case where the width W is 2 μm, the electrode elimination ratio is 3%, so the larger the size of the light-emitting region is, the more the display quality improvement ratio is improved.

In the display 1 obtained in such a manner, a scanning signal is supplied from the scanning line drive circuit 130 to each pixel through the gate electrode of the write transistor Tr2, and an image signal from the signal line drive circuit 120 through the write transistor Tr2 is stored in the retention capacitor Cs. In other words, the on-off operation of the drive transistor Tr2 is controlled according to a signal stored in the retention capacitor Cs, thereby a drive current Id is injected into each of the organic light-emitting devices 10R, 10G and 10B, and holes and electrons are recombined to cause light emission. The light passes through the second electrode 16 and the facing substrate 20 to be taken out.

In this case, even if a defect which may cause a bright spot defect such as a short circuit between the source electrode 35 and the drain electrode 36 occurs in the drive transistor Tr1 of a pixel, a repair process in which the laser beam LB is applied to the periphery E1 of the light-emitting region E of the pixel is performed, so a current does not flow into the light-emitting region E, so the pixel is no longer constantly a bright spot. Moreover, the first electrode 13 and the second electrode 16 in the light-emitting region E are maintained without being eliminated, so visibility of the pixel by the reflection of external light is rarely different from visibility of normal pixels around the pixel. Therefore, a decline in display quality is reduced.

Thus, in the embodiment, the laser beam LB is applied to the periphery E1 of the light-emitting region E of a pixel which is constantly a bright spot, so the eliminated area of the second electrode 16 is able to be reduced. Therefore, by the elimination of the second electrode 16 in the light-emitting region E, a decline in display quality which is that the visibility of the pixel by reflection of external light is different is able to be reduced. In particular, when the size of the display 1 is increased, and the size of the light-emitting region E is increased in proportion to the size of the display 1, the ratio of the eliminated area of the electrode to the area of the light-emitting region E is able to be reduced, and a more remarkable effect of improving display quality is able to be obtained.

Module and Application Examples

Application examples of the display described in the embodiment will be described below. The display according to the embodiment is applicable to displays of electronic devices in various fields which display a video signal inputted from outside or a video signal generated in the display as an image or video such as televisions, digital cameras, notebook personal computers and cellular phones.

Module

Figure 10:
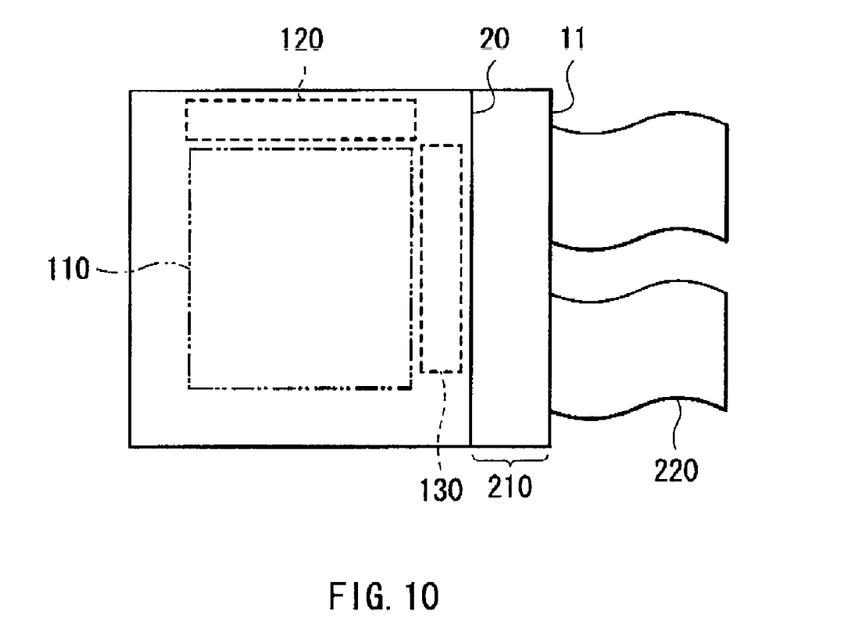
FIG. 10 is a plan view showing a schematic configuration of a module including the display according to the above-described embodiment.

The display according to the above-described embodiment is incorporated in various electronic devices such as application examples 1 to 5 which will be described later as a module shown in FIG. 10. The module has a region 210 exposed from a sealing substrate 20 and an adhesive layer (not shown), and an external connection terminal (not shown) is formed by extending wiring of the signal line drive circuit 120 and wiring of the scanning line drive circuit 130 in the exposed region 210. In the external connection terminal, a flexible printed circuit (FPC) 220 for signal input and output may be arranged.

Application Example 1

Figure 11:
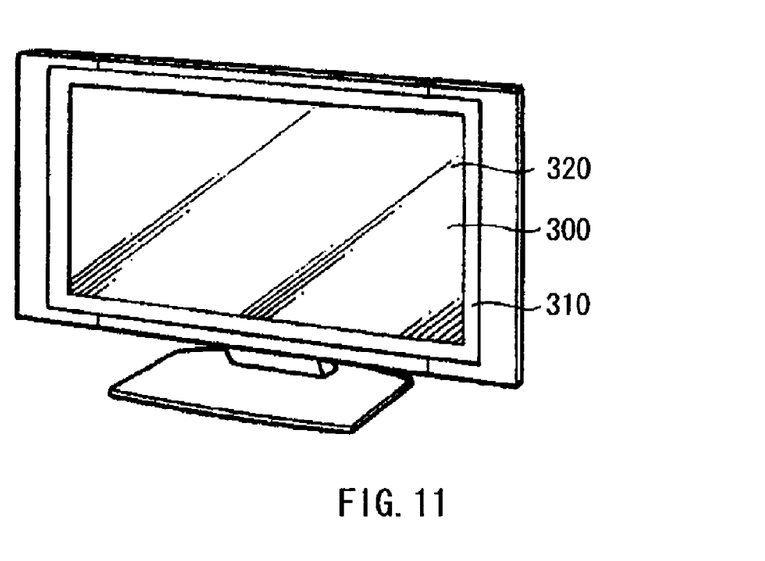
FIG. 11 is an external perspective view showing an application example 1 of the display according to the above-described embodiment.

FIG. 11 shows an external view of a television to which the display according to the above-described embodiment is applied. The television includes, for example, a video display screen section 300 including a front panel 310 and filter glass 320, and the video display screen section 300 is configured of the display according to the above-described embodiment.

Application Example 2

Figures 12A, 12B:
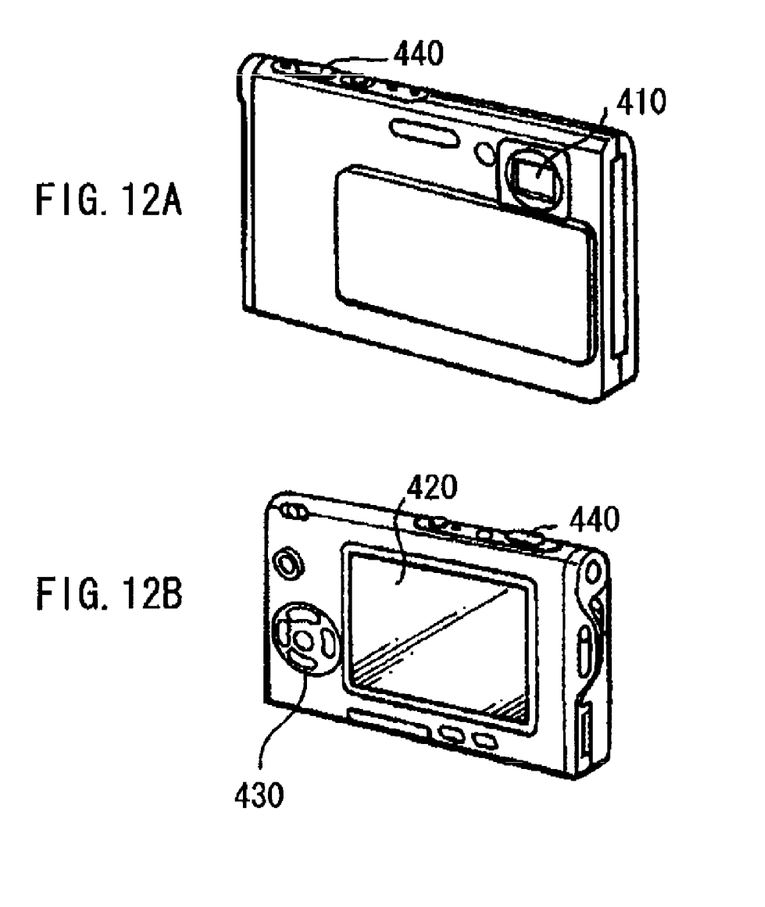
FIGS. 12A and 12B are external perspective views showing an application example 2 viewed from the front and the back, respectively.

FIGS. 12A and 12B show external views of a digital camera to which the display according to the above-described embodiment is applied. The digital camera includes a light-emitting section 410 for flash, a display section 420, a menu switch 430 and a shutter button 440, and the display section 420 is configured of the display according to the above-described embodiment.

Application Example 3

Figure 13:
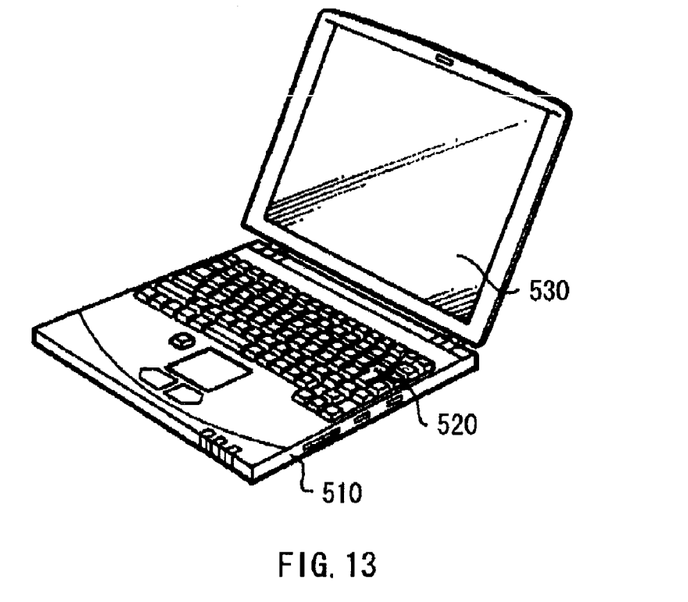
FIG. 13 is an external perspective view showing an application example 3.

FIG. 13 shows an external view of a notebook personal computer to which the display according to the above-described embodiment is applied. The notebook personal computer includes, for example, a main body 510, a keyboard 520 for input operation such as character input and a display section 530 for displaying an image, and the display section 530 is configured of the display according to the above-described embodiment.

Application Example 4

Figure 14:
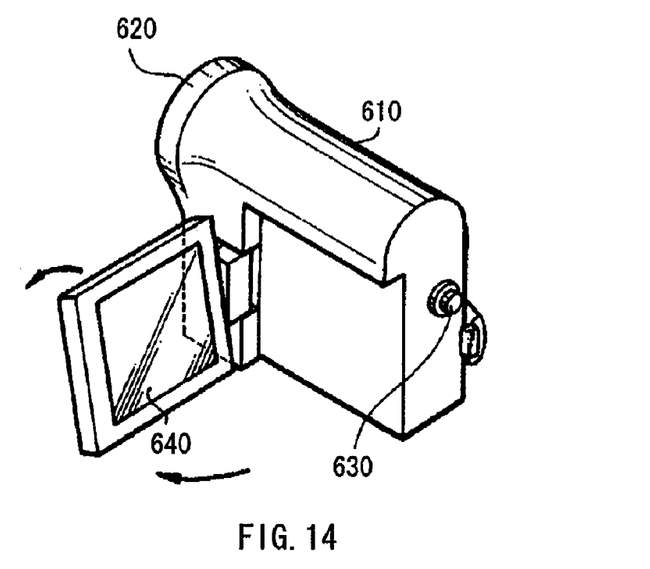
FIG. 14 is an external perspective view showing an application example 4.
Figures 15A, 15B:
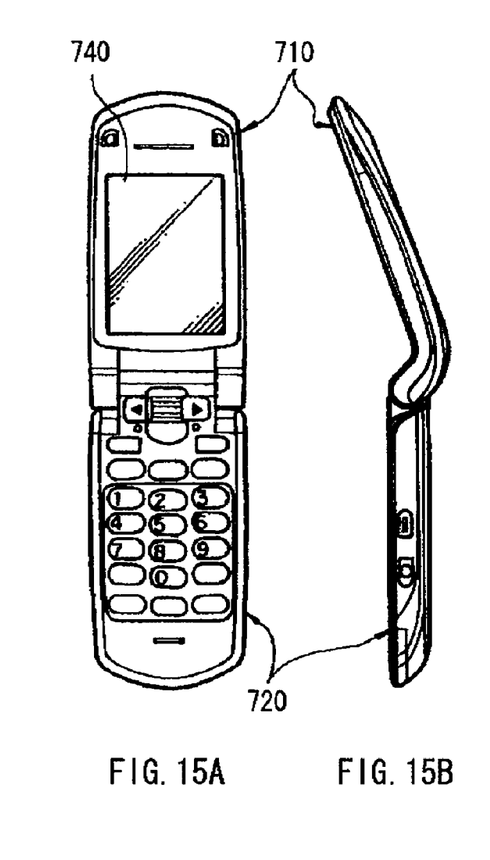
Figures 15C, 15G:
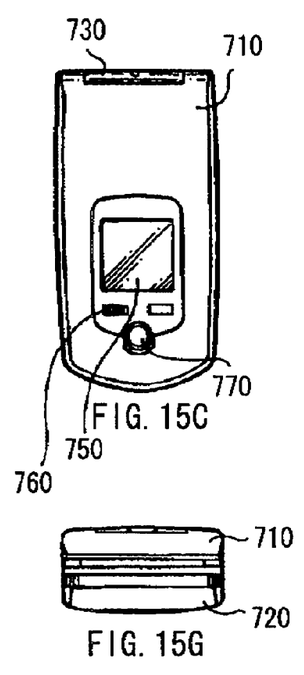
Figure 15E:
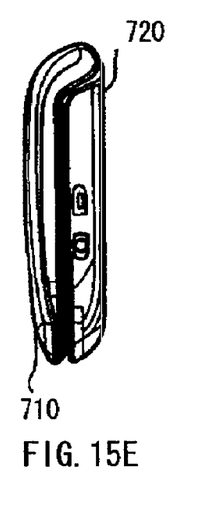
Figure 15F:
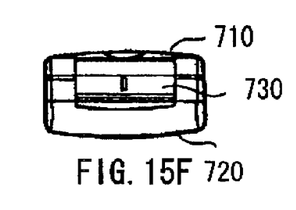

FIG. 14 shows an external view of a video camera to which the display according to the above-described embodiment is applied. The video camera includes, for example, a main body section 610, a lens 620 for shooting an object, a start/stop switch 630 for shooting and a display section 640, and the display section 640 is configured of the display according to the above-described embodiment.

Application Example 5

FIGS. 15A to 15G show external views of a cellular phone to which the display according to the above-described embodiment is applied. The cellular phone is formed by connecting a top-side enclosure 710 and a bottom-side enclosure 720 to each other by a connection section (a hinge section) 730, and includes a display 740, a sub-display 750, a picture light 760 and a camera 770. The display 740 or the sub-display 750 is configured of the display according to the above-described embodiment.

Although the present application is described referring to the embodiment; however, the application is not limited to the above-described embodiment, and may be variously modified. For example, in the above-described embodiment, the case where the thickness of the second electrode 16 is thin, and is easily eliminated, so the laser beam LB is applied from the second electrode 16 side is described; however, the laser beam LB may be applied from the first electrode 13 side. Moreover, the laser beam LB may be applied from both of the second electrode 16 side and the first electrode 13 side.

Moreover, in the above-described embodiment, the case of a top emission configuration in which the thickness of the second electrode 16 is reduced, and light generated in the light-emitting layer of the organic layer 15 is taken out from the second electrode 16 side is described; however, the application is applicable to a bottom emission configuration in which light generated in the light-emitting layer of the organic layer 15 is taken out from the first electrode 13 side. In the case of the bottom emission configuration, the laser beam LB may be applied from the first electrode 13 side or the second electrode 16 side or both of the second electrode 16 side and the first electrode 13 side.

Further, in the above-described embodiment, the case where the organic light-emitting devices 10R, 10G and 10B are formed in order in a matrix form as a whole on the display region 110 is described; however the organic light-emitting devices 10R, 10G and 10B are not specifically arranged in order, and may be arranged in any other form.

In addition, the material and thickness of each layer, the method and conditions of forming each layer are not limited to those described in the above-described embodiment, and each layer may be made of any other material with any other thickness by any other method under any other conditions.

In the above-described embodiment, the configurations of the organic light-emitting devices 10R, 10G and 10B are described in detail; however the organic light-emitting devices 10R, 10G and 10B do not necessarily include all layers, or may include any other layer. For example, a hole injection thin film layer made of a chromium oxide (III) ($Cr_2O_3$), ITO (Indium-Tin Oxide: a film in which an oxide of indium (In) and an oxide of tin (Sn) are mixed) may be arranged between the first electrode 13 and the organic layer 15. Further, for example, the first electrode 13 may be a dielectric multilayer film.

The configuration of the pixel drive circuit for active matrix drive is not limited to that described in the above-described embodiment, and a capacitor or a transistor may be added if necessary. In this case, depending on a change in the pixel drive circuit, a necessary drive circuit may be included in addition to the above-described signal line drive circuit 120 and the scanning line drive circuit 130.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A method of repairing an organic light-emitting display, the organic light-emitting display including an organic light-emitting device, the organic-emitting device including a plurality of pixels, each of the plurality of pixels including a first electrode, an organic layer including a light-emitting layer, and a second electrode on a substrate in order, each of the plurality of pixels emitting light from a light-emitting region where the first electrode and the second electrode overlap each other with the organic layer in between, the method comprising a step of:

applying a laser beam to the periphery of a light-emitting region of a defective pixel which is constantly a bright spot without applying the laser beam to the entire light-emitting region of the defective pixel.

2. The method of repairing an organic light-emitting display according to claim 1, wherein a laser light is applied along the periphery of the light-emitting region.

3. The method of repairing an organic light-emitting display according to claim 1, wherein a slit with a shape corresponding to the periphery of the light-emitting region is used, and the laser beam is applied to the periphery of the light-emitting region through the slit.

4. The method of repairing an organic light-emitting display according to claim 1, wherein a mask covers at least an inner portion of the light-emitting region and includes an opening corresponding to the periphery of the light-emitting region, and the laser beam is applied to the periphery of the light-emitting region through the opening.

5. The method of repairing an organic light-emitting display according to claim 1, wherein the laser beam is applied along the periphery of the light-emitting region of the defective pixel such that a laser beam applied portion extends inside and outside the light-emitting region.

6. The method of repairing an organic light-emitting display according to claim 5, wherein a width of the laser beam applied portion is 20 µm or less.

7. The method of repairing an organic light-emitting display according to claim 1, wherein the laser beam eliminates a portion of a second electrode in the periphery of the light-emitting region without eliminating all of the second electrode in the light-emitting region.

* * * * *